United States Patent [19]

Mitros

[11] Patent Number: 5,394,101
[45] Date of Patent: Feb. 28, 1995

[54] METHOD FOR DETECTING MOBILE IONS IN A SEMICONDUCTOR DEVICE

[75] Inventor: Jozef C. Mitros, Austin, Tex.

[73] Assignee: National Semiconductor Corporation, Santa Clara, Calif.

[21] Appl. No.: 4,028

[22] Filed: Jan. 15, 1993

[51] Int. Cl.⁶ ............................................. G01R 31/00
[52] U.S. Cl. .................................... 324/769; 324/760
[58] Field of Search ................ 324/73.1, 158 R, 71.1, 324/766, 769, 760; 437/8; 371/15.1; 257/48

[56] References Cited

U.S. PATENT DOCUMENTS

| 3,665,307 | 5/1972 | Cocca | 324/158 T |
| 4,520,448 | 5/1985 | Tremintin | 324/158 T |
| 4,950,977 | 8/1990 | Garcia et al. | 324/71.1 |

OTHER PUBLICATIONS

*Instabilities in Silicon Devices*, Silicon Passivation and Related Instabilities, vol. 1, Chapter 8, pp. 404-439, by G. Barbottin and A. Vapaille, copyright 1986.

*Primary Examiner*—Vinh Nguyen
*Attorney, Agent, or Firm*—H. Donald Nelson; Andrew C. Graham; Stephen R. Robinson

[57] ABSTRACT

A P-channel floating-gate MOS transistor is used to detect and measure positive mobile ions in the oxide layers of a semiconductor device. The transistor is first "programmed" by applying a voltage close to the breakdown voltage of the transistor, which causes electrons to tunnel through the oxide underlying the floating gate and to become trapped on the floating gate. This results in a negative voltage on the floating gate, which turns the transistor on and causes a first current, $I_{DS0}$ to flow through the transistor. The semiconductor device is then baked, or heated, to accelerate the movement of positive mobile ions attracted to the negative charge previously trapped on the floating gate. Any positive mobile ions collected by the floating gate will neutralize a portion of the negative charge on the floating gate and will create a less negative voltage on the floating gate, resulting in a lesser current through the device after the bake. A second transistor, identical to the floating-gate transistor but with a gate connected to a test pad, is used to measure the charge gained by the floating gate during the bake and the corresponding concentration of collected mobile ions.

11 Claims, 2 Drawing Sheets

5,394,101

METHOD FOR DETECTING MOBILE IONS IN A SEMICONDUCTOR DEVICE

BACKGROUND OF THE INVENTION

Field of the Invention

The present invention relates to semiconductor measurement techniques, and more specifically to methods for detecting the presence of, and for measuring the magnitude of, mobile ions contained in the oxide layers of an integrated circuit.

Description of Related Art

Currently MOS capacitors and MOS transistors are used to detect mobile ions in insulating layers of semiconductor devices. The most common electrical methods are Bias-Temperature Capacitance-Voltage (BTCV), Bias-Temperature Current-Voltage (BT-IV), Triangular Voltage Sweep (TVS), and Thermally Stimulated Ionic Conductivity (TSIC), which are discussed in *Instabilities in Silicon Devices,* Silicon Passivation and Related Instabilities, Volume 1, Chapter 8, pp. 404–439, edited by G. Barbottin and A. Vapaille, copyright 1986. The common feature of all these methods is the ability to detect mobile ions either between the electrodes of capacitors or between the gate and substrate of MOS transistors.

SUMMARY OF THE INVENTION

An advantage of the invention is the detection of or measurement of the magnitude of mobile ions contained in the oxide layers of an integrated circuit, even if contained in upper oxide layers of the integrated circuit.

A further advantage of the invention is in assessing the quality of a passivation layer of an integrated circuit, or for detecting cracks in the passivation layer.

A method in accordance with the present invention advantageously detects the presence of mobile ions in a region of a semiconductor device incorporating a transistor structure having a floating gate, including mobile ions in the insulating layers above the transistor structure, by first biasing the transistor structure to cause a charge accumulation on the floating gate and by subsequently determining a first value of a parameter of the transistor structure (for example, measuring a first current through the transistor structure) corresponding to the charge accumulation on the floating gate. An environment is then provided for the semiconductor device for a period of time to allow the movement of mobile ions to the floating gate, where the mobile ions neutralize a portion of the charge accumulation on the floating gate, leaving a remaining portion of the charge accumulation thereupon. A second value of the parameter is then determined (for example, measuring a second current through the transistor structure) corresponding to the remaining portion of the charge accumulation on the floating gate. This second value differs from the first value in accordance with the portion of the charge accumulation on the floating gate neutralized by the mobile ions.

In another embodiment in accordance with the current invention, a method for gauging the integrity of a passivation layer of a semiconductor device includes contaminating the surface of the passivation layer with a source of mobile ions and detecting the movement of the ions through the passivation layer to a floating gate of a transistor structure.

DETAILED DESCRIPTION OF THE PREFERRED EMBODIMENT

Figure 1:
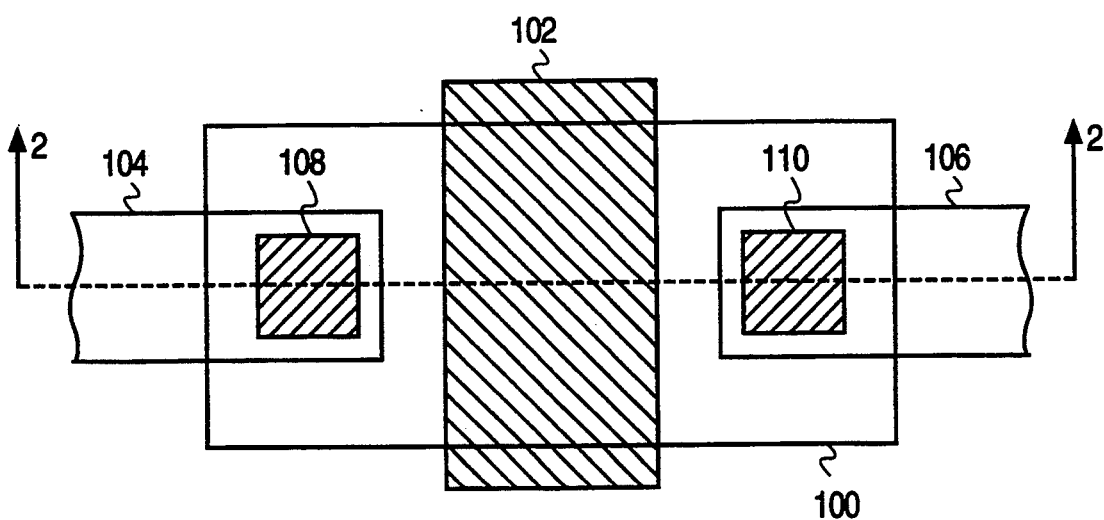
FIG. 1 shows a top view of a floating-gate MOS transistor layout suitable for a measurement method in accordance with the current invention.

A P-channel transistor with a single floating gate is preferably used to detect the presence of mobile ions in the insulating layers of a semiconductor device. FIG. 1 shows the layout of such a transistor, which is fabricated by conventional silicon gate processing techniques. The overlap of active area 100 and gate polysilicon 102 defines the actual thin oxide region of the MOS transistor. N-well field oxide 112 exists outside of active area 100. Contact openings 108 and 110 provide for a conducting path between respective metal lines 104 and 106 and the source/drain regions defined by the active area 100 and the gate polysilicon 102. Because no connection is provided to the gate polysilicon 102, the transistor has a floating gate.

Figure 2:
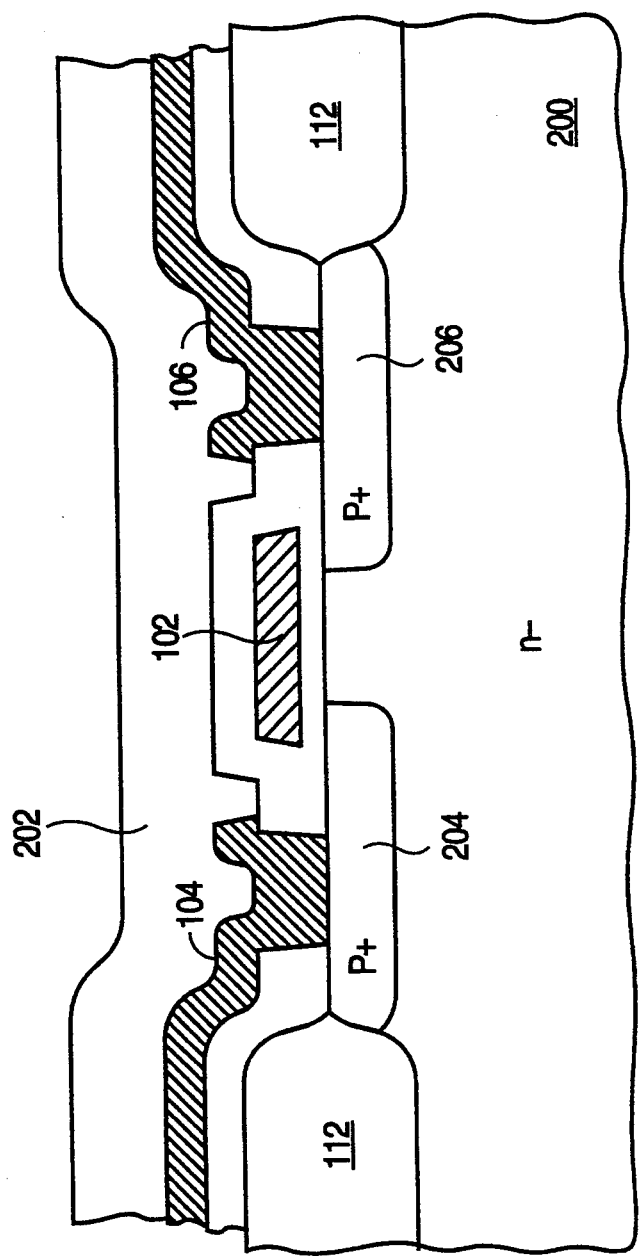
FIG. 2 shows a cross-section of a fabricated MOS transistor in accordance with the layout shown in FIG. 1.

A cross-section of such a P-channel device as fabricated is shown in FIG. 2. P+ source/drain regions 204 and 206 are formed in N-well 200, typically by ion-, implantation. Since in this illustrative embodiment the device is symmetrical, either region could be used as the source or drain. Passivation 202 provides a protective covering for the transistor.

To measure mobile ion concentration, the floating-gate transistor is first "programmed" by applying for a short time a drain-to-source voltage, $V_{DS}$, close to the transistor breakdown voltage, $BV_{DSS}$. Typically this is a 10 ms pulse of approximately $-14$ volts, with the source held at ground potential. The application of such a pulse to a suitably fabricated P-channel transistor (e.g., having a gate oxide thickness of approximately 230 Å and having a channel length of approximately 1.0 µm) causes avalanche current to flow and generates hot electrons. Some portion of these hot electrons is injected into the gate oxide underlying the floating gate polysilicon 102 and passes through the gate oxide and onto the floating gate polysilicon 102, where the negative charge of the electrons becomes trapped.

Next, a low drain voltage, preferably $V_{DS}=-1$ volt, is applied to the transistor with the source held at ground. The previous accumulation of negative charge on the floating gate causes the gate voltage to become negative, thereby turning on the P-channel transistor. With the drain biased at $-1$ volts, an initial "read" current, $I_{DS0}$, therefore flows from source to drain and is measured.

Positive mobile ions which may be present (e.g., sodium ions, $Na+$) in the oxide layers around the gate are attracted to the negative charge trapped on the floating gate. If any positive mobile ions are present and make their way to the floating gate, the positive charge of the mobile ions neutralizes the negative charge previously trapped on the floating gate, which raises the voltage of the floating gate. To accelerate the movement of the mobile ions, a bake is preferably performed. Illustratively, the bake is a short bake at a temperature of 390° C. for 30 minutes.

Any change in the transistor's gate voltage arising from mobile ions can be determined by the resulting change in measured $I_{DS}$, measured with $V_{DS} = -1$ volt as before. If the subsequent value of this "read" current, $I_{DS1}$, is different from the initial value, $I_{DS0}$, then mobile ions have been "collected" by the floating gate during the bake.

A second transistor, identical to the transistor of FIG. 1, but with a gate node connected to a test pad rather than left floating, is preferably used to quantify the mobile ions collected by the floating gate. By using the gate-connected second transistor, a gate voltage, $V_{GS0}$, is determined which produces a drain-to-source current equal to $I_{DS0}$. Likewise, a second gate voltage, $V_{GS1}$, is determined which produces a drain-to-source current equal to $I_{DS1}$. Because the two transistors are identical (except for the gate connection), equal voltages on the respective gates produces equal currents. Therefore, the gate voltage of the floating gate before and after the bake step is determined to be the same $V_{GS0}$ and $V_{GS1}$, respectively, measured from the second transistor.

Alternatively, the second transistor can be sized to generate a current in proportion to, rather than identical with, the current through the first transistor when identically biased. By taking the proportionality into account, the gate voltage of the floating gate can still be ascertained.

The change in charge of the floating gate is then determined by multiplying the change in voltage by the capacitance of the floating gate.

$$dQ = C^*dV = C^*[V_{GS1} - V_{GS0}] \quad (1)$$

The capacitance of the floating gate is preferably estimated using a numerical simulator of the type which provides a three-dimensional solution to Poisson's equations. Alternatively, the floating gate capacitance may be measured using suitable test structures (preferably including a first structure containing multiple parallel transistors connected to a test pad, and a second structure containing a test pad with all the same stray capacitances but with no connected transistors, to measure the combined capacitance of the interconnect, test pads, and test probes), although the measurement may be less accurate than the estimation due to the extremely small magnitude of the floating gate capacitance. Finally, the mobile ion concentration is determined by dividing the change in charge of the floating gate by the unit electronic charge (assuming the mobile ion is singly-ionized).

$$[ION] = dQ/q, \text{ where } q = -1.6 \times 10^{-19} \text{ coulombs} \quad (2)$$

In contrast to present techniques, this method advantageously detects and measures positive mobile ions from oxide layers all around the floating gate, including the thin oxide underlying the gate polysilicon 102 and the oxides and passivation overlying the transistor.

If the top surface of the passivation is intentionally contaminated by a substance containing a source of mobile ions (for example, a solution of sodium bicarbonate) before the bake step, the ability of the passivation layer to prevent the passage of mobile ions can be ascertained. The mobile ions will not penetrate through a high quality passivation layer and the measured $I_{DS1}$ will be virtually the same as the previously measured $I_{DS0}$. However, the mobile ions will penetrate through a poor quality passivation layer during the bake, and will collect on the floating gate, resulting in a measured value of $I_{DS1}$ different than $I_{DS0}$. If cracks are present in the passivation layer, the contaminant mobile ions will easily penetrate through these cracks and will be detected in the same fashion.

While the above embodiments describe methods utilizing a P-channel test structure fabricated with a single-poly, single-metal process, other processes are capable of fabricating suitable transistors. N-channel MOS transistors may be employed, although because the trapping of charge on the floating gate lowers the voltage of the floating gate and would tend to turn off an N-channel transistor (which would likely result in $I_{DS0}$ and/or $I_{DS1}$ showing no current flow), a depletion-mode N-channel MOS transistor is preferable to an enhancement-mode N-channel MOS transistor.

Additionally, while the preferred structures described in FIG. 1 and FIG. 2 are conventional "thin oxide" MOS transistors, other transistor structures may be capable of charge injection and storage on a floating gate and may be suitable as well. For example, a "field" transistor having a source node and a drain node each formed in adjacent active areas, separated by a "thick" field oxide, and further having a polysilicon structure disposed above the field oxide and between the adjacent active areas, may possess sufficient transistor characteristics to be useful for the method described above.

To preserve the ability to collect mobile ionic charge from the oxide layers above the transistor structure, additional conductive layers, such as other polysilicon layers and other metal layers, should not be disposed above the floating gate region. However, to isolate different oxide layers for measurement, several conductive layers can be connected together, all forming a collective floating gate. For instance, a particularly effective transistor structure for a passivation test includes a piece of the top metal layer (immediately below the passivation layer) connected to the floating gate. Any layers which are totally surrounded by an oxide will trap charge collected by the floating gate. For example, metal line segments and polysilicon segments can be connected as part of the floating gate, provided there is no connection to a source/drain region or no connection, such as an external connection, which would cause charge leakage from the floating gate. A connection to the gate terminal of another transistor is entirely consistent with charge trapping on the floating gate, and such a second transistor could in fact be used in an alternative embodiment to directly measure the voltage of the floating gate. For example, if a third transistor having an externally-controllable gate terminal is combined to form a differential pair with such a second transistor (whose gate terminal is connected as part of the floating gate of the first transistor), the voltage of the floating gate may be determined by sweeping the externally controllable gate terminal of the third transistor and noting the output switching point of the differential pair.

While the invention has been described with respect to the embodiments set forth above, the invention is not necessarily limited to these embodiments. For example, variations of the above described technique can be practiced with substantially similar results: different "programming" conditions, different "read" current biasing, different baking conditions, and different intentional contamination techniques may all be employed. Accordingly, other embodiments, variations, and improvements not described herein are not necessarily excluded from the scope of the invention, which is defined by the following claims.

I claim:

1. A method for detecting the presence of mobile ions in a region of a semiconductor device incorporating a transistor structure having a floating gate, comprising the steps of:

biasing the transistor structure to cause a charge accumulation on the floating gate;

determining, subsequent to the biasing step, a first value of a parameter of the transistor structure, said first value corresponding to the charge accumulation on the floating gate;

providing for the semiconductor device, subsequent to the first value determining step, an environment for a period of time to allow the movement of mobile ions to the floating gate, the mobile ions neutralizing a first portion of the charge accumulation thereupon and resulting in a remaining portion of the charge accumulation thereupon; and determining, subsequent to the providing step, a second value of the parameter of the transistor structure, said second value corresponding to the remaining portion of the charge accumulation on the floating gate, the second value differing from the first value in accordance with the first portion of the charge accumulation on the floating gate neutralized by the mobile ions thereby detected.

2. A method as in claim 1 wherein the parameter of the transistor structure is a voltage of the floating gate.

3. A method as in claim 1 wherein the parameter of the transistor structure is a current through the transistor structure.

4. A method as in claim 1 wherein the transistor structure comprises a P-channel transistor structure.

5. A method as in claim 1 wherein the transistor structure comprises an N-channel transistor structure.

6. A method as in claim 1 wherein the providing step comprises heating the semiconductor device to accelerate the movement of mobile ions.

7. A method as in claim 1 wherein the mobile ions are positive mobile ions and wherein the charge accumulation on the floating gate is a negative charge accumulation.

8. A method for detecting the presence of positive mobile ions in a region of a semiconductor device incorporating an MOS transistor having a drain terminal, a floating gate, an oxide underlying the floating gate, and a source terminal, comprising the steps of:

applying a first voltage to the drain terminal of the MOS transistor, the first voltage being of sufficient magnitude to cause electron injection into the oxide and a subsequent trapping of the electrons on the floating gate, resulting in a negative charge accumulation on the floating gate;

applying a second voltage subsequent to the first voltage applying step, of lower magnitude than the first voltage, to the drain terminal of the MOS transistor while measuring a first current therethrough;

providing for the semiconductor device, subsequent to the second voltage applying and first current measuring step, an environment for a period of time to allow the movement of positive mobile ions to the floating gate, the positive mobile ions neutralizing a first portion of the negative charge accumulation thereupon and resulting in a remaining portion of the negative charge accumulation thereupon; and applying the second voltage to the drain terminal of the MOS transistor, subsequent to the providing step, while measuring a second current therethrough corresponding to the remaining portion of the negative charge accumulation on the floating gate, the second current differing from the first current in accordance with the first portion of the negative charge accumulation on the floating gate neutralized by the positive mobile ions thereby detected.

9. A method as in claim 8 wherein the providing step comprises heating the semiconductor device to accelerate the movement to the floating gate of positive mobile ions electrostaticly attracted to the negative charge accumulation on the floating gate.

10. A method as in claim 8 wherein the first voltage is of the same order, but is also less than, the breakdown voltage of the MOS transistor.

11. A method as in claim 10 wherein the MOS transistor is a P-channel MOS transistor and wherein the second voltage is approximately equal to $-1$ volt.

* * * * *